United States Patent
Choi et al.

(10) Patent No.: US 12,123,931 B2
(45) Date of Patent: Oct. 22, 2024

(54) DIPOLE ANTENNA ARRAY FOR HYBRID MR-PET AND MR-SPECT SCANS AND USE THEREOF, AND MR-PET OR MR-SPECT TOMOGRAPH WITH A DIPOLE ANTENNA ARRAY

(71) Applicant: Forschungszentrum Juelich GmbH, Juelich (DE)

(72) Inventors: Chang-Hoon Choi, Juelich (DE); Joerg Felder, Juelich (DE); Suk Min Hong, Wuerselen (DE); Christoph Lerche, Herzogenrath (DE); Nadim Joni Shah, Juelich (DE)

(73) Assignee: FORSCHUNGSZENTRUM JUELICH GMBH, Juelich (DE)

( * ) Notice: Subject to any disclaimer, the term of this patent is extended or adjusted under 35 U.S.C. 154(b) by 438 days.

(21) Appl. No.: 17/615,124

(22) PCT Filed: May 8, 2020

(86) PCT No.: PCT/DE2020/000092
§ 371 (c)(1),
(2) Date: Nov. 30, 2021

(87) PCT Pub. No.: WO2020/244689
PCT Pub. Date: Dec. 10, 2020

(65) Prior Publication Data
US 2022/0236353 A1    Jul. 28, 2022

(30) Foreign Application Priority Data
Jun. 6, 2019  (DE) .................... 10 2019 003 949.1

(51) Int. Cl.
*H01Q 9/26*     (2006.01)
*G01R 33/48*    (2006.01)
(Continued)

(52) U.S. Cl.
CPC ............ *G01R 33/481* (2013.01); *H01Q 1/38* (2013.01); *H01Q 9/26* (2013.01); *H01Q 9/285* (2013.01); *H01Q 21/062* (2013.01)

(58) Field of Classification Search
CPC .......... G01R 33/481; H01Q 1/38; H01Q 9/26; H01Q 9/285; H01Q 21/062
See application file for complete search history.

(56) References Cited

U.S. PATENT DOCUMENTS

2005/0264464 A1* 12/2005 Rankin ............... H01Q 9/22
                                                                343/893
2015/0130465 A1   5/2015 Wiggins et al.
(Continued)

FOREIGN PATENT DOCUMENTS

DE          10322186 B3    12/2004
GB          1322300 A       7/1973
(Continued)

OTHER PUBLICATIONS

Nikolai, Evaluation of short folded dipole antennas as receive elements of ultra-high-field human head array (Year: 2019).*
(Continued)

*Primary Examiner* — Henry Luong
(74) *Attorney, Agent, or Firm* — LEYDIG, VOIT & MAYER, LTD.

(57) ABSTRACT

A dipole antenna array includes at least two dipole antenna elements. Each respective dipole antenna element has at one end a fold which consists of a bend, a bent region, and the projection of the bent region of the dipole antenna element onto a length of the dipole antenna element. Each respective dipole antenna element at least partially encloses a cavity.

15 Claims, 4 Drawing Sheets

(51) Int. Cl.
*H01Q 1/38* (2006.01)
*H01Q 9/28* (2006.01)
*H01Q 21/06* (2006.01)

(56) References Cited

U.S. PATENT DOCUMENTS

2015/0295320 A1* 10/2015 Lee .................. H01Q 9/26
                                                                                  324/322
2017/0164915 A1    6/2017 Li et al.

FOREIGN PATENT DOCUMENTS

WO    WO-2008100546 A1 *  8/2008  ........... A61K 31/29
WO    WO 2013159053 A1   10/2013

OTHER PUBLICATIONS

Janzen, Gerd; "Kurze Antennen"; Kurze Antennen: Entwurf und Berechnung verkürzter Sense-und Empfangsantennen; Jun. 1, 1986; p. 184-191, 210-213; Franckh-Kosmos Verlags-GmbH & co. KG; Stuttgart, Germany.
Avdievich, Nikolai I. et al; "Evaluation of short folded dipole antennas as receive elements of ultra-high-field human head array"; Magnetic Resonance in Medicine; Apr. 7, 2019; p. 811-824; vol. 82; No. 2; John Wiley & Sons, Inc.; Hoboken, USA.

* cited by examiner

DIPOLE ANTENNA ARRAY FOR HYBRID MR-PET AND MR-SPECT SCANS AND USE THEREOF, AND MR-PET OR MR-SPECT TOMOGRAPH WITH A DIPOLE ANTENNA ARRAY

CROSS-REFERENCE TO PRIOR APPLICATIONS

This application is a U.S. National Phase application under 35 U.S.C. § 371 of International Application No. PCT/DE2020/000092, filed on May 8, 2020, and claims benefit to German Patent Application No. DE 10 2019 003 949.1, filed on Jun. 6, 2019. The International Application was published in German on Dec. 10, 2020 as WO 2020/244689 under PCT Article 21(2).

FIELD

The disclosure relates to a dipole antenna array for hybrid magnetic resonance-positron emission tomography (MR-PET) and magnetic resonance-single photon emission computed tomography (MR-SPECT) tomographs, to the use thereof, and to an MR-PET or MR-SPECT tomograph with a dipole antenna array.

BACKGROUND

Radio-frequency antennas which are positioned in the magnetic bore and thus in the PET or SPECT measurement region are used for nuclear magnetic resonance imaging with hybrid MR-PET or MR-SPECT devices. In the combined methods in which the MRI images are made at the same time as PET or SPECT images, there is a need for the measurement components resulting from the PET or SPECT proportion to be obtained as free of interference as possible.

The MM coils serve to transmit and/or receive radio-frequency electromagnetic radiation. They usually operate in the near field of the antenna, in the case of high-field MRI also in the transition region between near field and far field, so that conductive structures, in other words antennas, must be arranged in the vicinity of the examination volume.

Combinations of MRI and PET or SPECT systems offer the advantage of enabling simultaneous measurements of two or more modalities. Technically, they are realized by integrating scintillation crystals and possibly the evaluation electronics in the magnetic bore of an MRI system. In order to keep the sensitivity losses of MRI measurements low, combined MR-PET or MR-SPECT systems require the MRI antennas, which are often also referred to as MRI coils, to be arranged within a PET/SPECT detector ring. This results in a strong coupling of the magnetic fields used in MRI with the PET/SPECT detector unit on the one hand, and an absorption of the gamma quanta of PET/SPECT measurement by the introduced antenna on the other hand.

PET and SPECT receive their signals from annihilation quanta, namely γ quanta with an energy usually of 511 keV. These are absorbed or scattered along the path they have traveled by matter on their preparation path. For this reason, the introduction of an MRI coil into a PET/SPECT system has a negative effect on the sensitivity of PET/SPECT measurement.

Due to the wavelength in MRIs according to the prior art, which operate in clinically approved devices with a maximum of 7T, or even 1.5 and 3T, which corresponds to a resonance frequency of approximately 300 MHz (7T), 128 MHz (3T), or 64 MHz (1.5T) for protons, straight dipoles are too long to ensure efficient coupling to the examination volume. For this reason, to shorten the dipole antenna used, components, such as inductors, are inserted into the dipole antenna, as is described in "Kurze Antennen: Entwurf und Berechnung verkürzter Sende-und Empfangsantennen" [Short antennas: design and calculation of shortened transmission and receiving antennas], Franckh, 1986 p. 408, ISBN 3440054691. The dipole antennas shortened in this way are usually also connected at the dipole center. However, all these measures lead to additional absorption or scattering of the PET/SEPCT γ quanta by highly absorbent material, such as electronic components and additional conductor structures in the PET/SPECT measurement volume.

The center connection of the dipole element adds further components, such as coaxial lines and concentrated components, to the PET/SPECT-sensitive region. In MM, the use of long dipole elements has a negative effect in two respects. On the one hand, they limit the measurement volume—for example, cylindrical arrangements of small-diameter dipoles, as desired for head imaging, can be geometrically limited by the broader anatomy in the shoulder region. Furthermore, straight dipole antennas create a large sensitive region along the magnetic axis, which often extends beyond the homogeneous region of the switchable gradient fields, and can thus lead to signal aliasing in the MM images.

MRI antennas must have as low a gamma quantum absorption as possible for quanta in the PET and/or SPECT energy ranges in order not to reduce the sensitivity of the nuclear-medicinal modality.

German patent DE 103 22 186 B3 discloses a dipole antenna which is folded and which has a connection in the fold.

SUMMARY

In an embodiment, the present invention provides a dipole antenna array. The dipole antenna array includes at least two dipole antenna elements. Each respective dipole antenna element has at one end a fold which consists of a bend, a bent region, and the projection of the bent region of the dipole antenna element onto a length of the dipole antenna element. Each respective dipole antenna element at least partially encloses a cavity.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
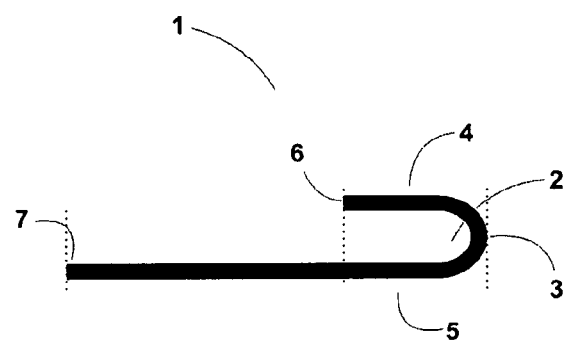
FIG. 1 illustrates a dipole antenna array in which the different regions or points are shown.

In the case of measurements in MR-PET or MR-SPECT devices, there is a need for the smallest possible quantities of material to be introduced into the examination volume or the spatial measurement region. There is a need to improve the quality of MRI-PET/SPECT measurements and with the combined MR-PET/SPECT devices to obtain a quality approximately identical to measurements with the separate components MRI, PET, and SPECT.

The present disclosure provides for an acquisition of MR-PET or MR-SPECT data which is particularly interference-free or has the lowest possible reduction in sensitivity in a combined system in comparison to devices for a single modality. Recordings are to be made possible which, with regard to the PET or the SPECT portion of MR-PET or MR-SPECT measurement, have an increased sensitivity compared to devices for combined MR-PET or MR-SPECT measurements according to the prior art, wherein as few artifacts as possible should occur, in particular, no aliasing in the MM images. The technical solution should be inexpensive and easy to implement. The attenuation and/or scattering of γ rays or other photons that are to be detected is to be minimized. Higher $B_0$ fields, such as ultra-high-field 7 tesla or >7 tesla as well as high-field ≥3 tesla, are to be made more accessible to use. Magnetic fields of 9.4 tesla, 10.5 tesla, 11.7 tesla, 14 tesla and even 20 tesla can be cited as examples. A backscattering and absorption of γ quanta is to be reduced or prevented.

With a dipole antenna array according to the present disclosure and the dipole antenna arrangement, it is now possible to generate interference-free MRI-PET/SPECT images which in particular have no aliasing in the MRI images or artifacts. The combined components of the MR-PET/SPECT tomograph have an almost identical quality as the individual components MR, PET and SPECT. The attenuation or scattering of γ rays is reduced. The use of higher $B_0$ fields, such as ultra-high-field 7 tesla or >7 tesla, such as 9.4 tesla, 10.5 tesla, 11.7 tesla, 14 tesla or even 20 tesla, as well as high-field ≥3 tesla, is made more easily accessible to use. Recordings are made possible which, with respect to the PET or the SPECT portion of MR-PECT or MR-SPECT measurement, have an increased sensitivity of measurement compared to these components in MR-PET or MR-PECT devices according to the prior art. The physical extension of the dipole antenna is shortened. The technical solution is cost-effective and technically easy to implement.

The term MRI-PET/SPECT hereinafter means that both embodiments MRI-PET and MRI-SPECT can be meant.

In the following, the dipole antenna array according to the disclosure is described in its general form, without this having to be interpreted restrictively.

According to the disclosure, a dipole antenna array is provided in which at least 2 dipole antenna elements folded on at least one side are joined in such a way that they at least partially surround a cavity.

In one embodiment, a dipole antenna element of the dipole antenna array is advantageously folded at one end by an angle of ≥90° to 180°, wherein the connections and components to which the dipole antenna array is connected are located in the fold, outside the measurement region of the PET-SPECT sensors, which is given by the width of the arrangement of PET or SPECT sensors in the PET/SPECT ring along its axis of rotation. In a further embodiment, a dipole antenna element is also folded at both ends.

The connection of connections and components outside the PET-SPECT measurement region, especially in the fold of the dipole antenna elements, results in there being no interference in the PET/SPECT measurement region to the measurement taking place. In this case, it is furthermore advantageous that further electronic components, for example interfacing circuits, transmitter/receiver switches or preamplifiers can thus also be arranged near the feed point of the antenna without influencing PET/SPECT measurements. γ quanta can no longer be absorbed by parts of the device located in the PET/SPECT measurement region, which prevents the γ quanta being scattered at these parts. The γ quanta typically have an energy of 511 keV.

The folding of the dipole antenna arrays results in the spatial extent of the dipole antenna array being shortened, which is advantageous in the limited free volume of hybrid MR-PET/SPECT devices. At the same time, an expedient folding, for example in the form of a "J", results in the electromagnetic fields emitted by the dipole antenna array in this region being reduced by geometrically anti-parallel currents. This reduces the coupling of the dipole to components in the vicinity of the feed point and the excitation of nuclear magnetic resonances in this region, which should be prevented. In particular, by preventing the excitation of nuclear magnetic resonances in the folded region of the dipole antenna, artifacts in the MRI images, due to aliasing for example, can be prevented.

The fold of the dipole antenna elements of the dipole antenna array, which is located outside the PET/SPECT measurement region, enables a power-matched electrical connection of the dipole formed by the dipole antenna array. This makes possible power-matched connection using a capacitor by the correct selection of the electrical connection points. The sensible selection of connection points results from the knowledge of the person skilled in the art.

If the connection is spatially close to the PET/SPECT measurement region, backscattering of γ quanta into the PET/SPECT measurement region can be reduced by a smaller number of components used.

The folded region region of the dipole antenna element comprises a bend, the bent longitudinal region, and the region of the vertical projection of the bent region onto the length of the dipole antenna element.

The bend can be a curve in the form of a segment of a circle, an ellipse, or a bend of a different geometry. A sharp bend in the dipole antenna array, which encloses an angle, is also possible. The bend can also be composed of at least two partial bends.

The bent part is that part which, after bending, is at an angle of ≥90° and 180° retrograde to the longitudinal direction of the dipole antenna.

The region of the perpendicular projection of the bent region onto the length of the dipole antenna element is the section of the dipole antenna element that is located in front of the bend in the longitudinal direction and in which the projection of the bent region that is perpendicular to the longitudinal direction of the dipole antenna element is imaged.

End points refers to the two ends of a dipole antenna element, i.e., the end of the straight part and the end of the bent region, as well as in the case of the embodiment in which there is a fold at both ends of the dipole antenna element, the end points of the two folds.

The measurement region of the dipole antenna array or of a dipole antenna element can be located in the region between the end point that has no bend and the point along the length of the dipole antenna array that results from the projection of the end point of the bent part onto the longitudinal direction. In one embodiment in which both ends of a dipole antenna element are folded, the measurement region can be located between the points resulting from the projection of the end point of the bent part in each case onto the longitudinal direction. This measurement region can be at least a subregion of said length section of the dipole antenna array or dipole antenna element and also depends on external factors, such as the design of the MR-PET or ME-SPECT device, or on the magnetic field. This is the length section, which can serve as a transmitter and receiver. The measurement region of a dipole antenna element or of the dipole antenna array is then at least a subregion of the section of a dipole antenna element or of the dipole antenna array in which there is no fold.

In particular, there are no connections, such as inductors, capacitors, connection lines, coaxial cables or preamplifiers, in the PET or SPECT measurement region of a dipole element or of the dipole antenna array.

The connections or components are preferably located at least partially in the fold of the dipole antenna element or of the dipole antenna array.

All connections and components are preferably located in the fold of the dipole antenna array or of a dipole antenna element. As a result, a better image quality of the PET or SPECT recording is achieved.

In a preferred embodiment, coaxial cables, for example, can be connected in such a way that their ends are distributed over the bent region of the fold and in the region of the vertical projection of the bent region onto the length of the dipole antenna element. This also makes possible a power-matched connection using a simple capacitor by making the correct selection of the electrical connection points.

The angle at which the dipole antenna array or a dipole antenna element is folded can have any desired value within the range of 90° and 180°. For example, it can be 95°, 100°, 115°, 120° . . . 165°, 170°, 175° or 179°.

A dipole antenna element of the dipole antenna array has a length between its end points that corresponds to $\lambda$2 of the wavelength at the resonance frequency. The physical length of $\lambda$2 may deviate from lower or upper values to the extent that a mode of operation is maintained in which a dipole-shaped current distribution over the dipole antenna array or dipole antenna element is maintained.

A dipole antenna element preferably has a cross-section that does not cause an abrupt change in the absorption coefficients for $\gamma$ radiation, for example a circular or elliptical cross-section. Artifacts in PET/SPECT image reconstruction can thereby be prevented.

A dipole antenna element of the dipole antenna array is preferably designed to be thin. Thin within the meaning of the disclosure means a thickness of a dipole antenna element corresponding to 1 to 5 the penetration depth of the high-frequency field into the dipole antenna element.

The dipole antenna array or a dipole antenna element preferably consists of an electrically conductive material, preferably a metal with a low atomic number, such as aluminum. The use of dipole antenna element materials with a low atomic number, as is the case with aluminum, also results in interference in PET/SPECT measurements and artifacts in the recorded images being prevented or reduced. The material selection of the conductor material for the dipole antenna array represents a compromise between electrical conductivity and a low atomic number.

The dipole antenna array can advantageously be combined to form a multi-channel MM coil, e.g., in order to increase the MM measurement region.

According to the disclosure, at least two dipole antenna elements are combined via a holder in an array in such a way that they surround a cavity. In practical application, 2, 3, 4, 5, 6, 7, 8, 9, 10, 11, 12, 13, 14, 15, 16 or more dipole antenna elements may surround a cavity that is preferably cylindrical, wherein the dipole antenna elements are arranged at a radial distance from the notionally enclosed cylinder. The upper number of dipole antenna elements arranged in this way is limited only by practical aspects.

The number of dipole antenna elements used can depend on the strength of the magnetic field or on the dimensions of the object to be examined. For example, 8 dipole antenna elements may be advantageous when scanning a head at 9.4 tesla. 16 dipole antenna elements may be advantageous when examining the entire human body. The higher the $B_0$ magnetic field used, the greater the interfering coupling between the dipole antenna elements, and the fewer dipole antenna elements are advantageously interconnected in a dipole antenna array. However, the interfering coupling between the dipole antenna elements can also be reduced by technical measures. These are known to the person skilled in the art.

The folds of the dipole antenna elements of a dipole antenna array can be distributed over the opposite ends of the longitudinal direction, but it is preferable to arrange the dipole antenna elements in the holder in such a way that they all curved ends are arranged at the same end of the longitudinal direction. In this way, all connections or components are at the same end of the dipole antenna array so that all cables can be led out of the carrier housing in the same direction.

In a simple embodiment, the holder, as means for holding dipole antenna elements together, can be two rings which are connected to the dipole antenna elements on the inside or outside thereof, or the dipole antenna elements can pass through holes in the rings so that they are fastened.

It is advantageous if retaining rings do not project into the measurement region of the PET-SPECT measurement region.

A cylinder to which the dipole antenna elements with fastening means are attached can also act as a holder.

The holder is preferably made of a non-magnetic material in which $\mu$ is approximately the same as that of air, preferably of plastic.

Some or all of the region of the dipole antenna element or of the dipole antenna array held together by a holder can be used for Mill measurements, so that the measurement region for MM can be larger than, equal to or smaller than that of the PET/SPECT system.

Various device elements can be connected in the fold of a dipole antenna element.

For example, a feed line may be connected via an interfacing network. In this case, a balun network can be connected together with an interfacing circuit directly or via an interfacing network. A detuning circuit can also be installed together with the interfacing circuit.

The disclosure also relates to a magnetic resonance imaging system, in particular a high-field/ultra-high-field magnetic resonance imaging system, a magnetic resonance spectroscopy or nuclear magnetic resonance spectroscopy system with an integrated PET or SPECT system with the previously described coil.

Furthermore, the disclosure relates to a use of the above-described dipole antenna array as high-frequency transmitter and/or receiver coil in magnetic resonance imaging, in particular high-field/ultra-high-field magnetic resonance imaging, magnetic resonance spectroscopy or nuclear magnetic resonance spectroscopy with an integrated PET or SPECT system.

Further features and advantages will become apparent from the following description of an embodiment of a coil arrangement according to the with reference to the accompanying drawings.

FIG. 1 shows a dipole antenna element 1 with a fold 2, which comprises a bend 3, a bent region 4, and a projection of the bent region 5. The end point on the bent region bears the reference sign 6, and the end point on the long side of the dipole antenna array bears the reference sign 7.

Figure 2:
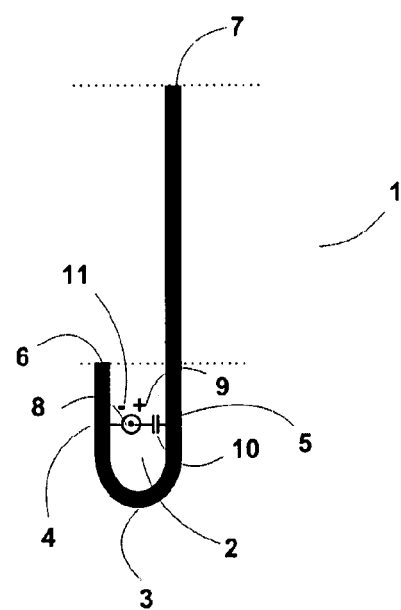
FIG. 2 illustrates a dipole antenna array in which connections are shown.

FIG. 2 shows a dipole antenna element 1 in which a coaxial cable 8 with the internal line 9 is connected to a capacitor 10 which is connected to the section of the dipole antenna element 1 which represents the projection of the bent region 5. The external line 11 of the coaxial cable 8 is in connection with the bent region 4.

Figure 3:
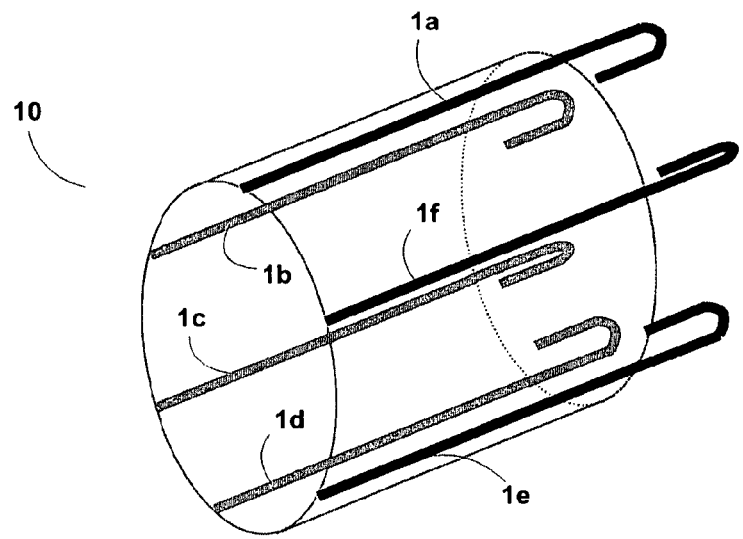
FIG. 3 illustrates a dipole antenna array in which 6 dipole antennas are arranged.

FIG. 3 shows a dipole antenna array 10 with band-shaped dipole antenna elements 1a to 1f, which are arranged cylindrically relative to one another, in a plan view in the longitudinal direction.

Figure 4:
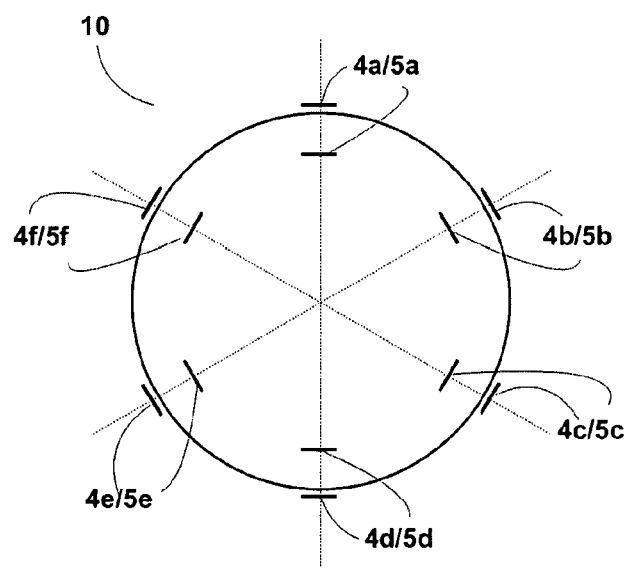
FIG. 4 illustrates a plan view of a dipole antenna array in the longitudinal direction.

FIG. 4 shows a plan view in the longitudinal direction of the dipole antenna array 10, in which the bent region 4a, 4b, . . . 4f and the projection of the bent region 5a, 5b, . . . 5f can be seen.

Figure 5:
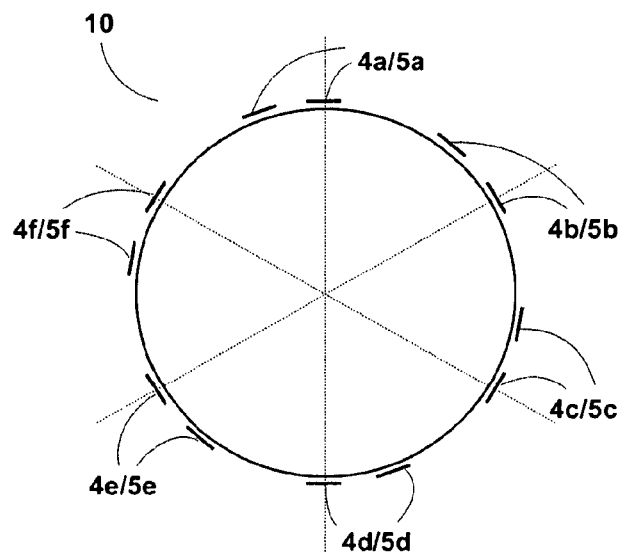
FIG. 5 illustrates a plan view of a dipole antenna array in the longitudinal direction.

FIG. 5 shows a dipole antenna array 10 in cross-section in which the in which the bent region 4a, 4b, . . . 4f and the projection of the bent region are arranged along the surface of the cylindrical circumference of a holder.

Figure 6:
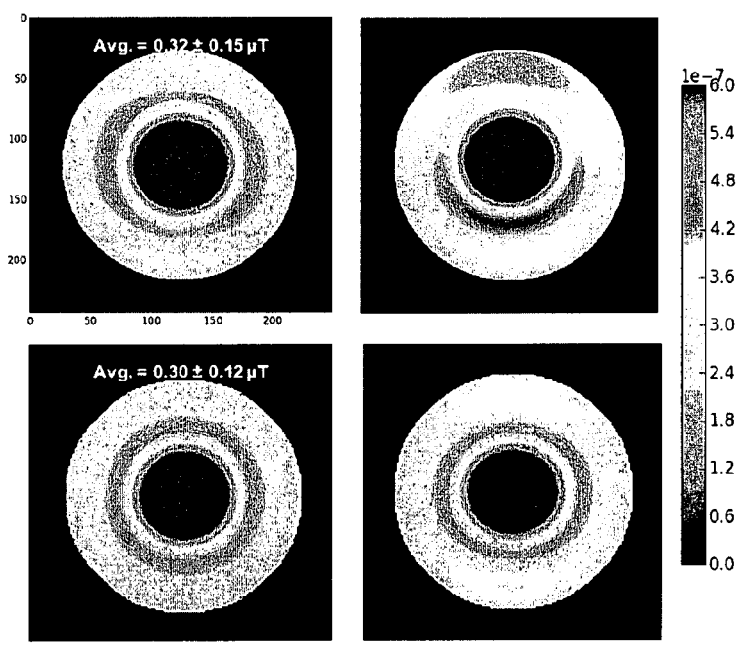
FIG. 6 illustrates a magnetic field of a ball phantom.

FIG. 6 shows the magnetic field in a ball phantom when using a dipole antenna array 10 compared to a linear antenna in the axial direction and in the sagittal direction.

Figure 7:
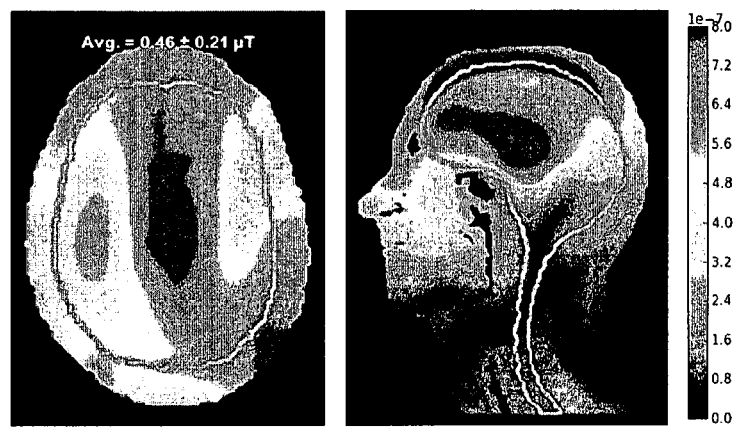
FIG. 7 illustrates recording of a head.

FIG. 7 shows the distribution of the magnetic field in a head when using a dipole antenna array 10 in the axial and sagittal directions.

Figure 8:
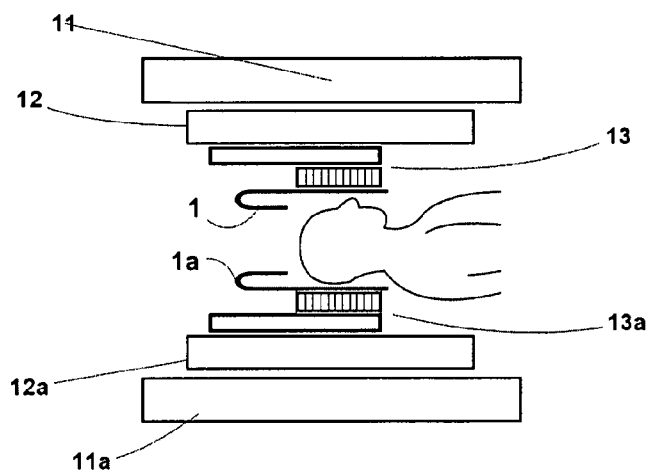
FIG. 8 illustrates a measuring arrangement with a patient whose head is to be scanned.

FIG. 8 shows an MRI-PET or MR-SPECT device in which there is a patient whose head is to be scanned. Shown in the figure is a magnet 11, 11a in which a gradient coil 12, 12a is located. Reference signs 13, 13a refer to PET modules in the case of the MR-PET device and to SPECT modules in the case of the MR-SPECT device. Dipole antenna elements that are part of the dipole antenna array have reference signs 1, 1a.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A dipole antenna array comprising:
   at least two J-shaped dipole antenna elements, each respective J-shaped dipole antenna element comprising a first length, a second length, and at least one bend connecting the first length to the second length, wherein the first length is longer than the second length, wherein a fold is formed that comprises the at least one bend, the second length, and a projection of the second length onto the first length, and
   wherein the at least two J-shaped dipole antenna elements at least partially enclose a cavity.

2. The dipole antenna array according to claim 1, wherein the fold is designed in such a way that it permits at least one connection of further components.

3. The dipole antenna array according to claim 1, wherein the at least one connection is configured to connect to one or more of a capacitor, electrical connection lines, a coaxial cable, inductors, preamplifier, interfacing circuits, transmission/reception switches, balun networks, interfacing networks, and/or detuning circuits.

4. The dipole antenna array according to claim 1, wherein there are no connections of further components outside the fold.

5. The dipole antenna array according to claim 1, wherein the at least one bend comprises a bend by an angle of ≥90° to 180°.

6. The dipole antenna array according to claim 1, wherein the at least one bend comprises a curve or a sharp bend.

7. The dipole antenna array according to claim 1, wherein connections for electrical components to each respective J-shaped dipole antenna element are distributed over each respective fold.

8. The dipole antenna array according to claim 1, wherein the at least two J-shaped dipole antenna elements are formed from a metal of a low atomic number.

9. The dipole antenna array according to claim 1, wherein a cross-section of the at least two J-shaped dipole antenna elements perpendicular to a longitudinal direction of the enclosed cavity is designed in such a way that it does not cause an abrupt change in absorption coefficients for gamma quanta.

10. The dipole antenna array according to claim 1, wherein the at least two J-shaped dipole antenna elements have a thickness corresponding to 1 to 5 times a penetration depth of a radio-frequency field output by the dipole antenna array.

11. The dipole antenna array according to claim 1, wherein the at least two J-shaped dipole antenna elements are 3 to 16 dipole antenna elements.

12. The dipole antenna array according to claim 1, further comprising at least one dipole antenna element is-folded at both ends.

13. The dipole antenna array according to claim 1, wherein each respective fold of each respective J-shaped dipole antenna element is located at a same end of the dipole antenna array.

14. A method for magnetic resonance-positron emission tomography (MR-PET) or magnetic resonance-single photon emission computed tomography (MR-SPECT) tomograph, comprising:
  providing a dipole antenna array, the dipole antenna array comprising:
    at least two dipole antenna elements, wherein each respective dipole antenna element has at one end a fold which consists of a bend, a bent region, and the projection of the bent region of the dipole antenna element onto a length of the dipole antenna element,
  wherein each respective dipole antenna element at least partially encloses a cavity,
  wherein folds of the dipole antenna elements with connections are located outside a PET or SPECT measurement region.

15. A magnetic resonance-positron emission tomography (MR-PET) or magnetic resonance-single photon emission computed tomography (MR-SPECT) tomograph, comprising:
  a dipole antenna array, comprising:
    at least two dipole antenna elements, wherein each respective dipole antenna element has at one end a fold which consists of a bend, a bent region, and the projection of the bent region of the dipole antenna element onto a length of the dipole antenna element,
  wherein each respective dipole antenna element at least partially encloses a cavity, and
  wherein folds of the dipole antenna elements with connections are located outside a PET or SPECT measurement region.

* * * * *